US010879330B1

(12) United States Patent
Cui et al.

(10) Patent No.: US 10,879,330 B1
(45) Date of Patent: Dec. 29, 2020

(54) ARRAY SUBSTRATE, DISPLAY PANEL AND DISPLAY DEVICE

(71) Applicant: Wuhan Tianma Micro-Electronics Co., Ltd., Wuhan (CN)

(72) Inventors: Ruili Cui, Wuhan (CN); Bo Li, Wuhan (CN); Xingxing Yang, Wuhan (CN); Yingjie Chen, Wuhan (CN); Yongzhi Wang, Wuhan (CN); Tao Peng, Wuhan (CN); Ruiyuan Zhou, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 0 days.

(21) Appl. No.: 16/662,773

(22) Filed: Oct. 24, 2019

(30) Foreign Application Priority Data

Jun. 27, 2019 (CN) .......................... 2019 1 0570570

(51) Int. Cl.
*H01L 27/32* (2006.01)
*H04M 1/02* (2006.01)

(52) U.S. Cl.
CPC ........ *H01L 27/3267* (2013.01); *H01L 27/326* (2013.01); *H04M 1/0264* (2013.01); *H04M 1/0266* (2013.01)

(58) Field of Classification Search
CPC ............... H01L 27/3218; H01L 27/326; H01L 27/3262; H01L 27/3267; H01L 27/3272; H01L 27/3276; H01L 27/3244; H01L 27/3248
See application file for complete search history.

(56) References Cited

U.S. PATENT DOCUMENTS

| 2019/0206955 A1* | 7/2019 | Paek | H01L 27/3218 |
| 2019/0325190 A1* | 10/2019 | Cui | H01L 27/3276 |
| 2019/0371879 A1* | 12/2019 | Li | H01L 27/3276 |

FOREIGN PATENT DOCUMENTS

CN 107829065 A 3/2018

* cited by examiner

*Primary Examiner* — Cuong Q Nguyen
(74) *Attorney, Agent, or Firm* — Miller, Matthias & Hull LLP (57) ABSTRACT

An array substrate includes a display area, a non-display area, an optical component setting area and multiple pixels; the non-display area includes a first non-display area and a second non-display area; the first non-display area surrounds the optical component setting area, the display area surrounds the first non-display area, and the second non-display area surrounds the display area; the display area includes a first display area and a second display area, the second display area is located between the first non-display area and the second non-display area; the pixels include multiple first pixels and multiple second pixels, the first pixels are located in the first display area, the second pixels are located in the second display area, and a pixel density of the second display area is less than a pixel density of the first display area.

20 Claims, 10 Drawing Sheets

ARRAY SUBSTRATE, DISPLAY PANEL AND DISPLAY DEVICE

CROSS-REFERENCES TO RELATED APPLICATIONS

This application claims priority to Chinese patent application No. 201910570570.7 filed on Jun. 27, 2019, the disclosure of which is incorporated herein by reference in its entirety.

TECHNICAL FIELD

The present disclosure relates to a field of display technology and, in particular, to an array substrate, a display panel and a display device.

BACKGROUND

With the development of display technology, a display device is gradually improved from a visual effect with a narrow border to a borderless visual effect, so as to improve the screen-to-body ratio of the display device. The setting position of a sensor module, such as a camera, an infrared sensor or other photosensitive devices, in a display device with high screen-to-body ratio will have a certain influence on the display effect of the display device.

Currently, how to integrate the sensor module in the display panel of the display device and how to make the display device have a higher screen-to-body ratio and a better display effect become technical problems to be solved urgently.

SUMMARY

Embodiments of the present disclosure provide an array substrate, a display panel and a display device to increase the area of effective display area and improve display uniformity, thereby improving user experiences and display effect.

In a first aspect, an embodiment of the present disclosure provides an array substrate.

The array substrate includes a display area, a non-display area and an optical component setting area. The non-display area includes a first non-display area and a second non-display area. The first non-display area surrounds the optical component setting area. The display area surrounds the first non-display area. The second non-display area surrounds the display area. The display area includes a first display area and a second display area. The second display area is located between the first non-display area and the second non-display area and is connected to the first non-display area and the second non-display area respectively.

The array substrate further includes a plurality of pixels. The plurality of pixels includes a plurality of first pixels and a plurality of second pixels. The first pixels are located in the first display area, and the second pixels are located in the second display area. A pixel density of the second display area is less than a pixel density of the first display area.

In a second aspect, based on the same invention concept, an embodiment of the present disclosure provides a display panel including the array substrate described above.

In a third aspect, based on the same invention concept, an embodiment of the present disclosure provides a display device.

The display device includes the above display panel, and an optical component disposed in the optical component setting area.

The embodiments of the present disclosure provide an array substrate, display panel and display device. The array substrate includes a display area, a non-display area and an optical component setting area. The non-display area includes a first non-display area and a second non-display area, and the display area includes a display area and a second display area. In the array substrate, the first non-display area surrounds the optical component setting area, the display area surrounds the first non-display area, the second non-display area surrounds the display area, and the second display area is located between the first non-display area and the second non-display area and connects the first non-display area and the second non-display area. The array substrate further includes a plurality of pixels. The plurality of pixels includes first pixels and second pixels. The first pixels are set in the first display area, the second pixels are set in the second display area, and a pixel density of the second display area is less than a pixel density of the first display area. According to the embodiments of the present disclosure, the pixel density of the second display area is set to be less than the pixel density of the first display area. Therefore, in one aspect, the number of leads from the first display area to the second display area is reduced, so that the number of windings in the first non-display area is reduced, thereby reducing the size of the first non-display area, increasing the area of the effective display area, and enhancing the display effect; and in another aspect, the second display area has a smaller pixel density, so that a larger reserved space is formed between two adjacent second pixels in the second display area, and a pixel compensation element can be set in the reserved space, thereby implementing the pixel compensation, improving display non-uniformity and enhancing the display effect. Meanwhile, the reserved space between two second pixels in the second display area can be configured to set a light-sensitive device, so that there is no need to reserve space in the non-display area for the light-sensitive device, thereby increasing the area of the effective display area and enhancing the display effect.

DETAILED DESCRIPTION

Hereinafter the present disclosure will be further described in detail in conjunction with the drawings and embodiments. It is to be understood that the specific embodiments set forth below are intended to illustrate and not to limit the present disclosure. Additionally, it is to be noted that, for ease of description, only part, not all, of the structures related to the present disclosure are illustrated in the drawings.

Figure 1:
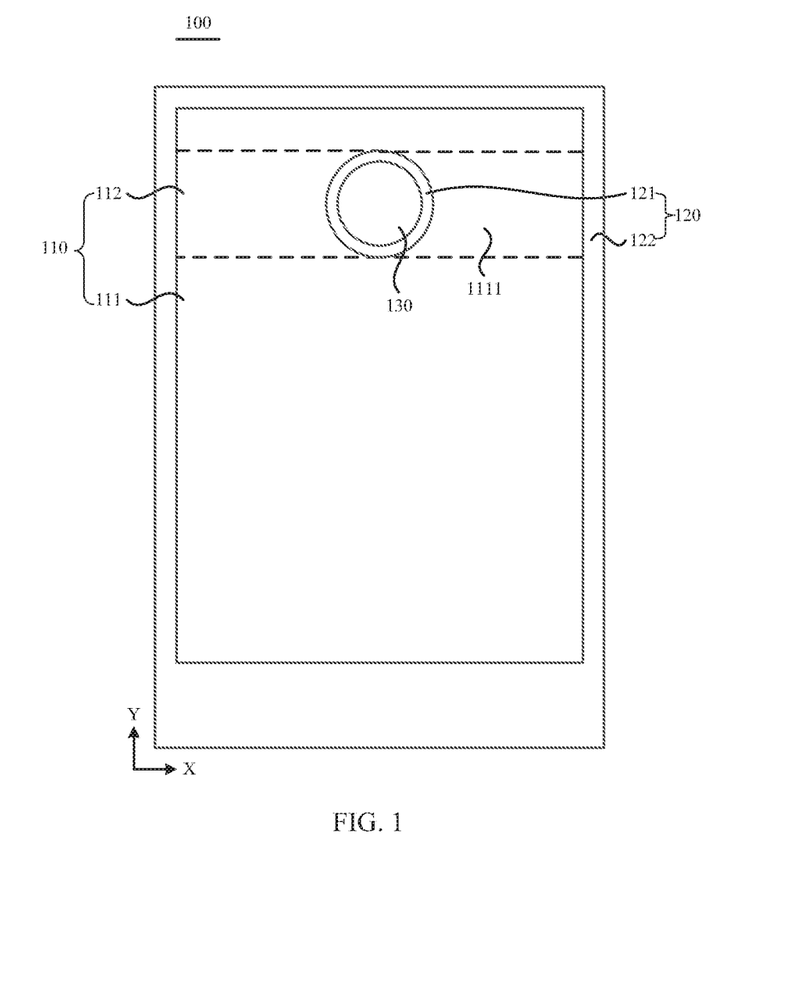
FIG. 1 is a top view of an array substrate according to an embodiment of the present disclosure.

FIG. 1 is a top view of an array substrate according to an embodiment of the present disclosure. As shown in FIG. 1, an array substrate 100 provided by the embodiment of the present disclosure includes a display area 110, a non-display area 120 and an optical component setting area 130. The non-display area 120 includes a first non-display area 121 and a second non-display area 122. The first non-display area 121 surrounds the optical component setting area 130. The second non-display area 122 surrounds the display area 110. The display area 110 includes a first display area 111 and a second display area 112. The second display area 112 is located between the first non-display area 121 and the second non-display area 122, and connects the first non-display area 12 and the second non-display area 122.

The array substrate 100 further includes a plurality of pixels. The plurality of pixels includes a plurality of first pixels and a plurality of second pixels. The first pixels are located in the first display area 111, and the second pixels are located in the second display area 112. A pixel density of the second display area 112 is less than a pixel density of the first display area ill.

In this embodiment of the present disclosure, the first pixels located in the first display area 111 may be uniformly arranged in the first display area 111, the second pixels located in the second display area 112 may be uniformly arranged in the second display area 112, and the first pixel and the second pixel may have the same structure. The pixel density of the second display area 112 is less than the pixel density of the first display area 111, that is, in the first display area 111 and the second display area 112 with the same area, the number of pixels in the second display area 112 is less than the number of pixels in the first display area 111.

It is to be noted that FIG. 1 is only an exemplary drawing of this embodiment of the present disclosure, and as shown in FIG. 1, the second non-display area 122, the second display area 112 and the first non-display area 121 are sequentially arranged in an X direction. In addition, the arrangement of the first non-display area, the second display area and the second non-display area may also be in other forms, which is not specifically limited in this embodiment of the present disclosure.

Figure 2:
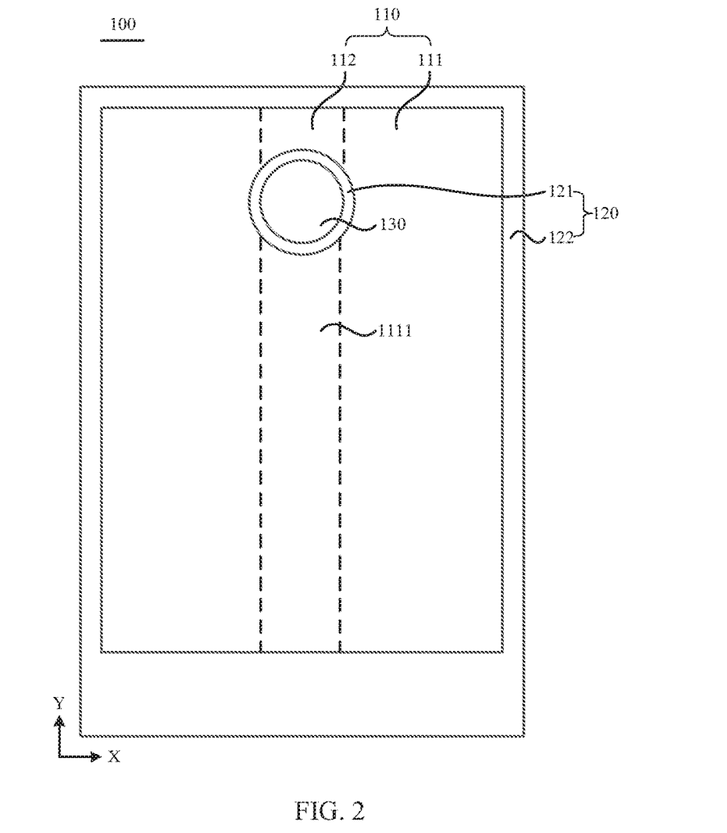
FIG. 2 is a top view of another array substrate according to an embodiment of the present disclosure.

Exemplarily, FIG. 2 is a top view of another array substrate according to an embodiment of the present disclosure. The similarities in FIG. 2 with those in FIG. 1 are not described herein, and only the parts in FIG. 2 different from those in FIG. 1 are described in an exemplary manner. As shown in FIG. 2, the first non-display area 121, the second display area 112 and the second non-display area 122 are sequentially arranged in a Y direction.

In this embodiment, the pixel density of the second display area is set to be less than the pixel density of the first display area. Therefore, in one aspect, the number of leads from the first display area to the second display area is reduced, so that the number of windings in the first non-display area is reduced, thereby reducing the size of the first non-display area, increasing the area of the effective display area and enhancing the display effect; and in another aspect, the second display area has a smaller pixel density, so that a larger reserved space is formed between two adjacent second pixels in the second display area, and a pixel compensation element can be set in the reserved space, thereby implementing the pixel compensation, improving the display non-uniformity and enhancing the display effect. Meanwhile, the reserved space between two second pixels in the second display area can be configured to set a light-sensitive device, so that there is no need to reserve space in the non-display area for the light-sensitive device, thereby increasing the area of the effective display area and enhancing the display effect.

In this embodiment of the present disclosure, in the case that the first display area 111 and the second display area 112 have a same area, the number of pixels in the second display area 112 is less than the number of pixels in the first display area 111 may be that in the X direction, the number of second pixels in the second display area 112 is less than the number of pixels in the first display area 111; and/or may be that in the Y direction, the number of second pixels in the second display area 112 is less than the number of pixels in the first display area 111. The specific arrangement of pixels in the first display area 111 and in the second display area 112 is not limited specifically in this embodiment of the present disclosure.

In an embodiment, second display area per unit area includes n columns of the second pixels, and first display area per unit area includes m columns of the first pixels, where n is less than m, and both n and m are positive integers.

Exemplarily, with continued reference to FIG. 1, the second non-display area 122, the second display area 112 and the first non-display area 121 are arranged in the X direction, and at this point, the X direction may be taken as a column direction of the arrangement of pixels in the array substrate 100. The second pixels in the second display area 112 sequentially extend in the X direction and are sequentially arranged in the Y direction. The first pixels in the first display area 111 sequentially extend in the X direction and are sequentially arranged in the Y direction. The second display area 112 per unit area includes n columns of second pixels, the first display area per unit area includes m columns of first pixels, and n is less than m. That is, in the case where the areas of the first display area 111 and the second display area 112 are the same, in the Y direction, the number of second pixels in the second display area 112 is less than the number of first pixels in the first display area 111. Therefore, the number of signal lines connecting the first pixels of the first display area 111 and the second pixels of the second display area 112 can be reduced, compared with the case in the existing art where on the premise that the areas of the first display area 111 and the second display area 112 are the same, and the number of second pixels in the second display area 112 is equal to the number of first pixels in the first display area 111 in the Y direction. When the signal lines connecting the first pixels of the first display area 111 and the second pixels of the second display area 112 need to be wound in the first non-display area 121, the number of windings in the first non-display area 121 can be reduced, thereby reducing the area of the first non-display area 121, increasing the area of the effective display area (i.e., the first display area 111 and the second display area 112), and enhancing the display effect.

Exemplarily, with continued reference to FIG. 2, the second non-display area 122, the second display area 112 and the first non-display area 121 are arranged in the Y direction, and at this point, the Y direction may be taken as a column direction of the arrangement of pixels in the array substrate 100. The second pixels in the second display area 112 sequentially extend in the Y direction and are sequentially arranged in the X direction. The first pixels in the first display area 111 sequentially extend in the Y direction and are sequentially arranged in the X direction. The second display area 112 per unit area includes n columns of second pixels, the first display area per unit area includes m columns of first pixels, and n is less than m. That is, in the case where the areas of the first display area 111 and the second display area 112 are the same, in the X direction, the number of second pixels in the second display area 112 is less than the number of first pixels in the first display area 111. Therefore, compared with the case in the existing art where on the premise that the areas of the first display area 111 and the second display area 112 are the same, the number of second pixels in the second display area 112 is equal to the number of first pixels in the first display area 111 in the X direction, the number of signal lines connecting the first pixels of the first display area 111 and the second pixels of the second display area 112 can be reduced. When the signal lines connecting the first pixels of the first display area 111 and the second pixels of the second display area 112 need to be wound in the first non-display area 121, the number of windings in the first non-display area 121 can be reduced, thereby reducing the area of the first non-display area 121, increasing the area of the effective display area (i.e., the first display area 111 and the second display area 112), and enhancing the display effect.

In an embodiment, when the number of columns of second pixels in the second display area per unit area is less than the number of columns of first pixels in the first display area per unit area, the first display area may include a display sub-area, and the display sub-area, the optical component setting area and the second display area are arranged in the second direction. The second display area may include P columns of second pixels, and P columns of the second pixels are arranged in the first direction and extend in the second direction; and the display sub-area includes Q columns of first pixels, and the Q columns of the first pixels are arranged in the first direction and extend in the second direction; where P is less than Q, and P and Q are positive integers. In the second direction, the P columns of the second pixels are in a one-column-to-one-column correspondence with P columns of the first pixels in the display sub-area.

Figure 3:
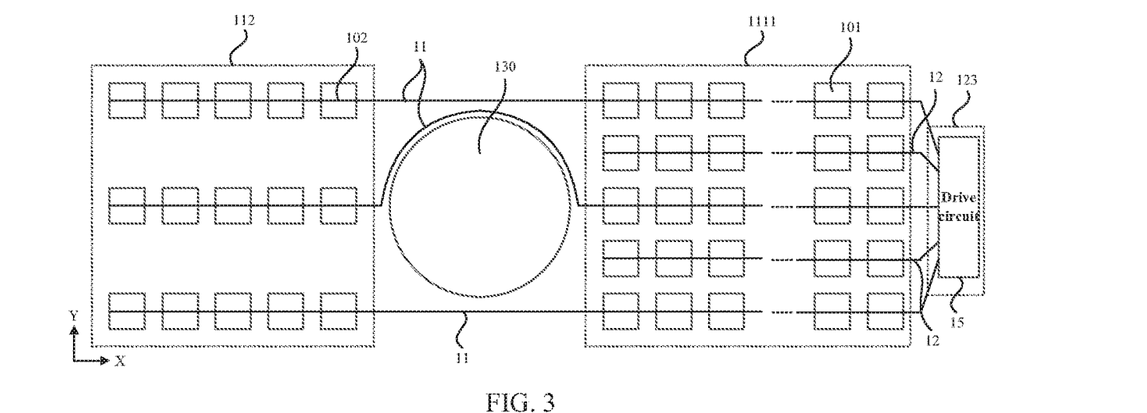
FIG. 3 is a structural diagram of distribution of a part of pixels on an array substrate according to an embodiment of the present disclosure.

Exemplarily, FIG. 3 is a structural diagram of distribution of a part of pixels on an array substrate according to an embodiment of the present disclosure. With reference to FIGS. 1 and 3, the first direction is the Y direction, and the second direction is the X direction. The display sub-area 111 in the first display area 111, the optical component setting area 130 and the second display area 112 are arranged in the second direction X, and in the first direction Y, the width of the display sub-area 1111 is the same as the width of the second display area 112. The second display area 112 includes three columns of second pixels 102, and the display sub-area 1111 includes five columns of first pixels 101. At this point, the three columns of first pixels 101 in the display sub-area 1111 are in the one-column-to-one-column correspondence with the three columns of second pixels 102 in the second display area 112. Therefore, the first pixels 101 and the second pixels 102 in the same column, i.e., having the one-column-to-one-column correspondence, can share a signal line in a column direction, and a column of first pixels 101 having no correspondence with the second pixels 102 can share a signal line in a column direction, thereby reducing the number of windings in the first non-display area 121, reducing the area of the first non-display area 121, increasing the area of the effective display area (i.e., the first display area 111 and the second display area 112), and enhancing the display effect.

Figure 4:
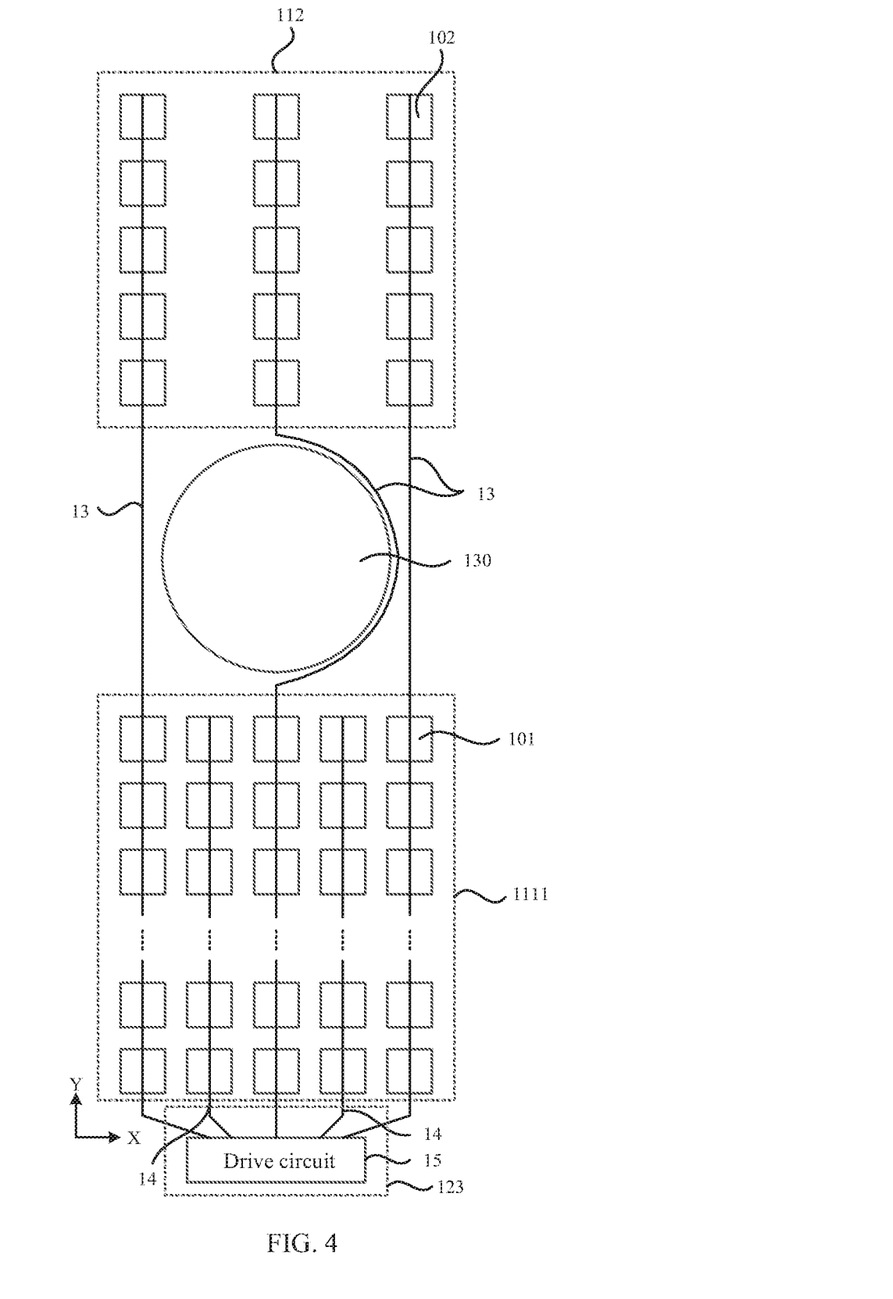
FIG. 4 is a structural diagram of distribution of a part of pixels on another array substrate according to an embodiment of the present disclosure.

Exemplarily, FIG. 4 is a structural diagram of distribution of a part of pixels on another array substrate according to an embodiment of the present disclosure. With reference to FIGS. 2 and 4, the first direction is the X direction, and the second direction is the Y direction. The display sub-area 1111 in the first display area 111, the optical component setting area 130 and the second display area 112 are arranged in the second direction Y, and in the first direction X, the width of the display sub-area 1111 is the same as the width of the second display area 112. The second display area 112 includes three columns of second pixels 102, and the display sub-area 1111 includes five columns of first pixels 101. At this point, the three columns of first pixels 101 in the display sub-area 1111 are in the one-column-to-one-column correspondence with the three columns of second pixels 102 in the second display area 112. Therefore, the first pixels 101 and the second pixels 102 in the same column, i.e., having the one-column-to-one-column correspondence, can share a signal line in a column direction, and a column of first pixels 101 having no correspondence with the second pixels 102 can share a signal line in a column direction, thereby reducing the number of windings in the first non-display area 121, reducing the area of the first non-display area 121, increasing the area of the effective display area (i.e., the first display area 111 and the second display area 112), and enhancing the display effect.

In addition, the pixel of the array substrate also includes a driver transistor, and the driver transistor requires a corresponding drive circuit to supply signals thereto. The drive circuit is capable of driving the driver transistor in the pixel to be turned on, and/or controlling corresponding data signals to be inputted into the pixel through the turned-on driver transistor.

In an embodiment, the second non-display area includes a drive circuit setting area for setting the drive circuit. The drive circuit setting area is located on a side of the second non-display area adjacent to the display sub-area. The array substrate also includes a plurality of signal lines, and the drive circuit is configured to provide signals for the signal lines. The plurality of signal lines includes a plurality of first signal lines and a plurality of second signal lines. One of the first signal lines is electrically connected to the first pixels and the second pixels in the same column, where the first signal lines extend in the second direction and run through the first non-display area in the winding manner; and one of the second signal lines is electrically connected to one column of the first pixels which are not in the same column as the second pixels.

Exemplarily, with continued reference to FIGS. 1 and 3, the drive circuit setting area 123 of the second non-display area 121 is configured to set a drive circuit 15, the drive circuit setting area 123 is located on a side of the second non-display area 122 adjacent to the display sub-area 1111, and the drive circuit 15 is capable of providing signals for the corresponding signal lines. When the array substrate 100 is an array substrate of a liquid crystal display panel, the drive circuit 15 set in the drive circuit setting area 123 may be a gate drive circuit. The gate drive circuit 15 may provide gate signals to the driver transistor in the pixel, and drive the driver transistor to be turned on to control a corresponding data signal to be written into the pixel. Correspondingly, the signal line may be a gate line. When the array substrate 100 is an array substrate of an organic light-emitting display panel, since a pixel drive circuit is provided in a pixel of the organic light-emitting display panel, the pixel drive circuit may be, for example, a 7T1C pixel drive circuit. In order to enable the pixel drive circuit to implement a drive function, it is necessary to provide a light-emitting control signal, a reference voltage signal, a scan signal, a data voltage signal, a positive power supply voltage signal and the like for the pixel drive circuit. At this point, the drive circuit 15 may be at least one of a scan-driving circuit or a light-emitting control circuit, and correspondingly, the signal line may be at least one of a scan signal line, a light-emitting control signal line or a reference signal line. For ease of description of the technical solution in FIG. 3, the drive circuit 15 may be a scan-driving circuit, and the signal line may be a scan signal line, and other situations may be referred to the following description, which is not repeated herein.

In the array substrate 100, the first direction is the Y direction, and the second direction is the X direction. The same column of pixels in the array substrate 100 share a same signal line, and the signal line extends from the drive circuit setting area 123 in the X direction. Three columns of first pixels 101 in the display sub-area 1111 are in the one-column-to-one-column correspondence with three columns of second pixels 102 in the second display area 112. The first pixels 101 and the second pixels 102 in the same column, i.e., having the one-column-to-one-column correspondence, share a first signal line 11, and in the two columns of first pixels 101 that do not correspond to a column of second pixels 102 in the second display area 112, the first pixels 101 in the same column share a second signal line 12. At this point, the first signal line 11 extends in the second direction X and runs through the first non-display area 121 in the winding manner; and the second signal line 12 only needs to be connected to the first pixels 101 in the display sub-area 1111, and does not need to extend in the second direction X and run through the first non-display area 121 in the winding manner. Therefore, compared with the case in the existing art where all columns of first pixels in the display sub-area are in the one-column-to-one-column correspondence with the second pixels in the second display area, the number of signal lines extending in the second direction X and running through the first non-display area 121 in the winding manner may be reduced, thereby reducing the area of the first non-display area 121, increasing the area of the effective display area (i.e., the first display area 111 and the second display area 112), and enhancing the display effect.

Exemplarily, with continued reference to FIGS. 2 and 4, the drive circuit setting area 123 of the second non-display area 121 is configured to set a drive circuit 15, the drive circuit setting area 123 is located on a side of the second non-display area 122 adjacent to the display sub-area 1111, and the drive circuit 15 is capable of providing signals for corresponding signal lines. When the array substrate 100 is the array substrate of the liquid crystal display panel, the drive circuit 15 set in the drive circuit setting area 123 may be a data drive circuit. The data drive circuit 15 may write a data voltage signal into a pixel though the turned-on driver transistor in the pixel. Correspondingly, the signal line may be a data line. When the array substrate 100 is the array substrate of the organic light-emitting display panel, since a pixel drive circuit is provided in a pixel of the organic light-emitting display panel, the pixel drive circuit may be, for example, a 7T1C pixel drive circuit. In order to enable the pixel drive circuit to implement a drive function, it is necessary to provide a light-emitting control signal, reference voltage signal, a scan signal, a data voltage signal, a positive power supply voltage signal and the like for the pixel drive circuit. At this point, the drive circuit 15 may be at least one of a data drive circuit or a drive circuit for providing positive power supply voltage signals, and correspondingly, the signal line may be at least one of a data signal line or a positive power supply voltage signal line. For easy of description of the technical solution in FIG. 4, the drive circuit 15 may be a data drive circuit, and the signal line may be a data signal line, and other situations may be referred to the following description, which is not repeated herein.

In the array substrate 100, the first direction is the X direction, and the second direction is the Y direction. A same column of pixels in the array substrate 100 share a same signal line, and the signal line extends from the drive circuit setting area 123 in the Y direction. Three columns of first pixels 101 in the display sub-area 1111 are in the one-column-to-one-column correspondence with three columns of second pixels 102 in the second display area 112. The first pixels 101 and the second pixels 102 in a same column, i.e., having the one-column-to-one-column correspondence, share a first signal line 13, and in the two columns of first pixels 101 that do not correspond to a column of the second pixels 102 in the second display area 112, the first pixels 101 in a same column share a second signal line 14. At this point, the first signal line 13 extends in the second direction Y and runs through the first non-display area 121 in the winding manner, and the second signal line 14 only needs to be connected to the first pixels 101 in the display sub-area 1111 and does not need to extend in the second direction Y and run through the first non-display area 121 in the winding manner. Therefore, compared with the case in the existing art where all columns of first pixels in the display sub-area are in the one-column-to-one-column correspondence with the second pixels in the second display area, the number of signal lines extending in the second direction Y and running through the first non-display area 121 in the winding manner can be reduced, thereby reducing the area of the first non-display area 121, increasing the area of the effective display area (i.e., the first display area 111 and the second display area 112), and enhancing the display effect.

In this embodiment of the present disclosure, as shown in FIG. 2, since the optical component setting area 130 is located between the display sub-area 1111 of the first display area and the second display area 112, when the first pixels and the second pixels in the same column share the signal line, the first pixels in the display sub-area 1111 need to be connected to the second pixels in the second display area 112 through the signal line extending in the second direction Y and running through the first non-display area 121, or end at the display sub-area 1111. At this point, the signal line connecting the first pixels in the display sub-area 1111 and/or the second pixels in the second display area 112 will be different from the signal line connecting the other first pixels in the first display area 111, so that signals received by the first pixels in the display sub-area 1111 and by the second pixels in the second display area 112 will be different from the signals received by other first pixels in the first display area 111 during the signal transmission process, thereby causing the phenomenon of display non-uniformity. In addition, in FIG. 1, the signals received by the first pixels in the display sub-area 1111 and by the second pixels in the second display area 112 will also be different from the signals received by other first pixels in the first display area 111, which will also cause the phenomenon of display non-uniformity.

In an embodiment, the second display area further includes at least one compensation unit. The at least one compensation unit includes a compensation load, and the compensation load is electrically connected to the second pixels and/or the first pixels.

In this embodiment of the present disclosure, the compensation unit may be disposed between two adjacent pixels. The relative positions of the second display area, the first non-display area and the second non-display area may be as shown in FIG. 1, and the arrangement of pixels in the second display area 112 may be as shown in FIG. 3. At this point, the column direction of the array substrate is the X direction, and the compensation unit may be disposed between two adjacent columns of second pixels 102. The relative positions of the second display area, the first non-display area and the second non-display area may also be as shown in FIG. 2, and the arrangement of pixels in the second display area 112 may be as shown in FIG. 4. At this point, the column direction of the array substrate is the Y direction, and the compensation unit may also be disposed between two adjacent columns of second pixels 102. The setting of the compensation unit will be described exemplarily with reference to the drawings.

Figure 5:
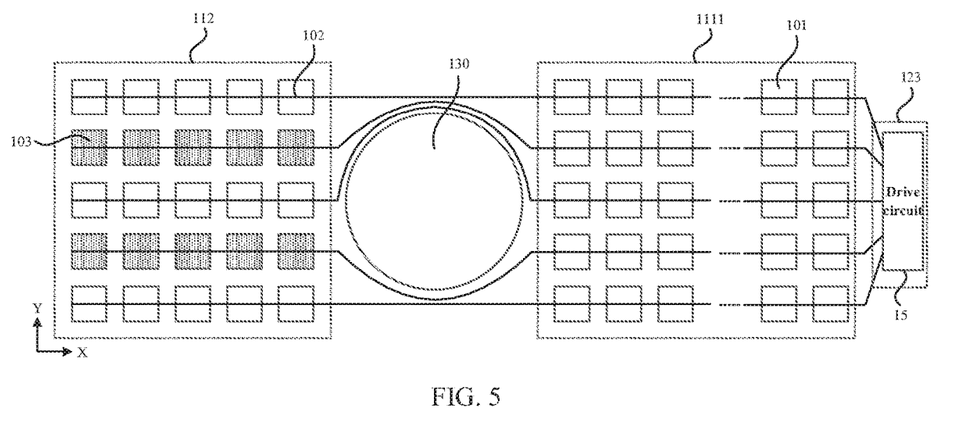
FIG. 5 is a structural diagram of distribution of a part of pixels on another array substrate according to an embodiment of the present disclosure.

Exemplarily, with reference to FIGS. 1 and 5, the X direction of the array substrate 100 is the column direction, and the Y direction is the row direction. Since the pixel density of the second display area 112 is less than the pixel density of the first display area 111, the number of pixel columns in the first display area 111 per unit area may be greater than the number of pixel columns in the second display area 112 per unit area, so that the compensation unit 103 may be disposed between two adjacent columns of second pixels 102 in the second display area 112. The compensation unit 103 is electrically connected to the first pixels 101 in the display sub-area 1111 to compensate for the voltage, current, resistance, etc. of the first pixels 101 in the display sub-area 1111, and the compensation unit 103 may be, for example, a compensation resistor and/or a compensation capacitor, thereby reducing the display difference between the first pixels 101 in the display sub-area 1111 and other first pixels 101 in the first display area 111, improving the display non-uniformity and enhancing the display effect.

Figure 6:
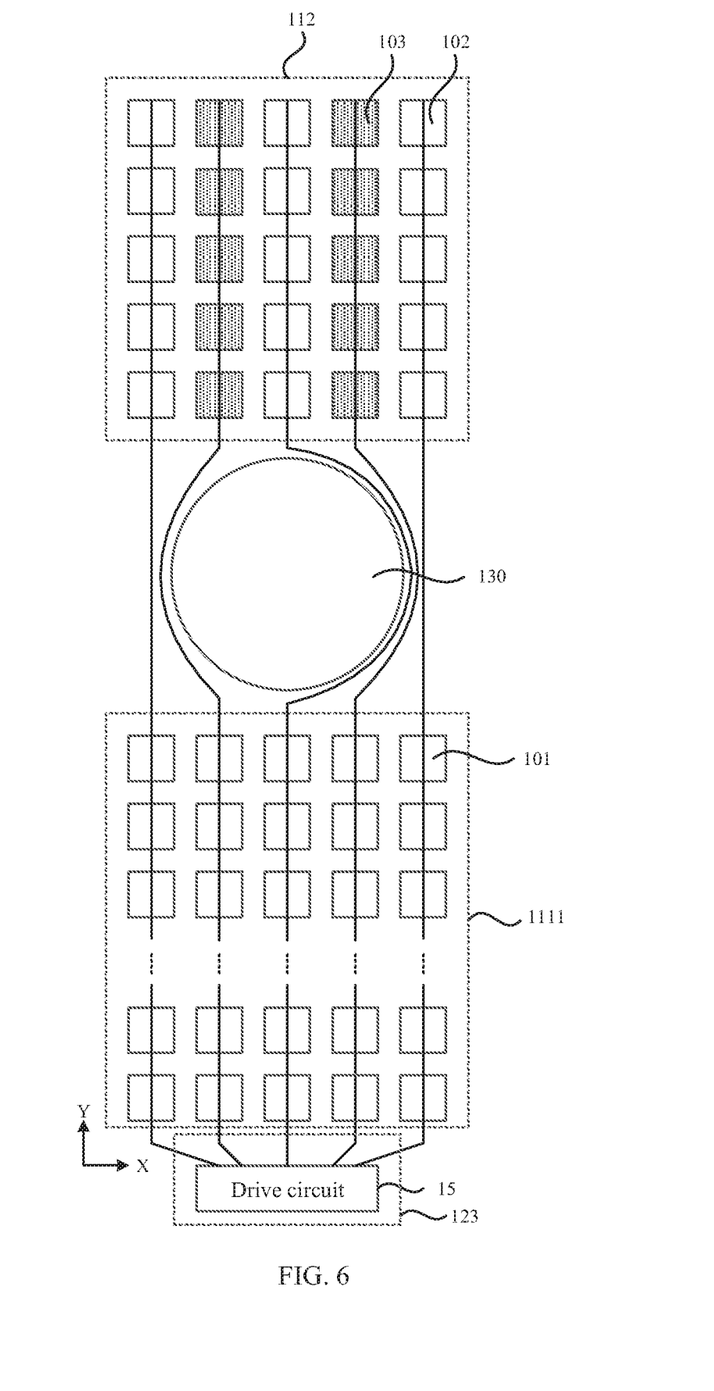
FIG. 6 is a structural diagram of distribution of a part of pixels on another array substrate according to an embodiment of the present disclosure.

Exemplarily, with reference to FIGS. 2 and 6, the Y direction of the array substrate 100 is the column direction, and the X direction is the row direction. Since the pixel density of the second display area 112 is less than the pixel density of the first display area 111, the number of pixel columns in the first display area 111 per unit area may be greater than the number of pixel columns in the second display area 112 per unit area, so that the compensation unit 103 may be disposed between two adjacent columns of second pixels 102 in the second display area 112. The compensation unit 103 is electrically connected to the first pixels 101 in the display sub-area 1111 to compensate for the voltage, current and resistance of the first pixels 101 in the display sub-area 1111, and the compensation unit 103 may be, for example, a compensation resistor and/or a compensation capacitor, thereby reducing the display difference between the first pixels 101 in the display sub-area 1111 and other first pixels 101 in the first display area 111, improving the display non-uniformity and enhancing the display effect.

In addition, the arrangement of pixels in the second display area 112 in FIGS. 1 and 2 can also be in other forms. For example, in the row direction, the compensation unit may be disposed between two adjacent second pixels, and at the same time, in the column direction, the compensation unit may also be disposed between two adjacent second pixels. For ease of description, the technical scheme is exemplified below by using the partition form in FIG. 2 as an example, and the technical principle of the partition form in FIG. 1 is similar to that in FIG. 2, which will not be repeated herein.

Figure 7:
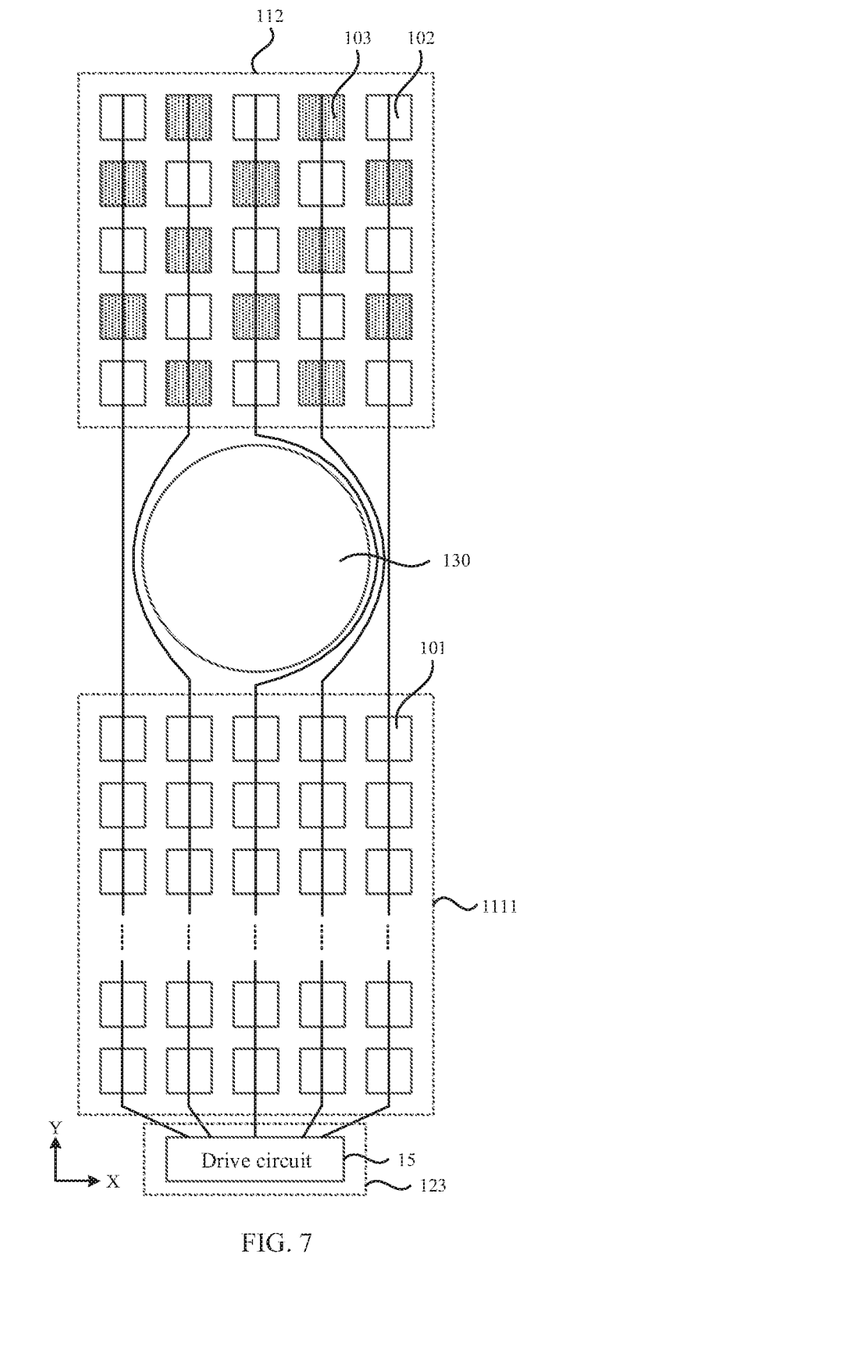
FIG. 7 is a structural diagram of distribution of a part of pixels on another array substrate according to an embodiment of the present disclosure.

Exemplarily, with reference to FIGS. 2 and 7, the Y direction of the array substrate 100 is the column direction, and the X direction is the row direction. Since the pixel density of the second display area 112 is less than the pixel density of the first display area 111, in the first display area 111 and the second display area 112 with the same area, the number of pixels in the second display area 112 in both the row direction X and the column direction Y is less than the number of first pixels 101 in the first display area 111. Therefore, the compensation unit 103 can be disposed in the space between two adjacent second pixels 102 in the row direction or in the space between two adjacent second pixels 102 in the column direction. The compensation unit is electrically connected to the second pixels 102 and the first pixels 101 in the display sub-area 1111 respectively, to respectively compensate for the voltage, current, resistance, etc. of the second pixels 102 and the first pixels 101 in the display sub-area 1111. The compensation unit 103 may be, for example, a compensation resistor and/or a compensation capacitor, thereby reducing the display difference between the second pixels 102 and other first pixels in the first display area 111, and the display difference between the first pixels 101 in the display sub-area 1111 and other first pixels in the first display area 111, improving the display non-uniformity and enhancing the display effect.

In an embodiment, with continued reference to FIGS. 2 and 7, the number of first pixels 101 per unit area in the first display area 111 is equal to the sum of second pixels 102 and compensation units 103 per unit area in the second display area 112. Therefore, the space of the second display area 112 can be fully used to perform pixel compensation, thereby further improving the phenomenon of display non-uniformity and improving the display effect.

In an embodiment, when the compensation unit in the second display area is a compensation resistor, the compensation resistor may have a block structure or a plane spiral structure.

Exemplarily, with continued reference to FIGS. 2 and 7, if the difference between the first pixels 101 in the display sub-area 1111 of the first display area 111 and other first pixels in the first display area 111 is caused by the winding of the data signal lines, the compensation resistors 103 may be disposed in the same layer as the data signal lines and are electrically connected to the first pixels 101 and/or the second pixels 102 through the data signal lines; or, when the difference between the first pixels 101 in the display sub-area 1111 of the first display area 111 and other first pixels in the first display area 111 is caused by the winding of scan signal lines, the compensation resistors 103 may be disposed in the same layer as the scan signal lines and are electrically connected to the first pixels 101 and/or the second pixels 102 through the scan signal lines.

Figure 8:
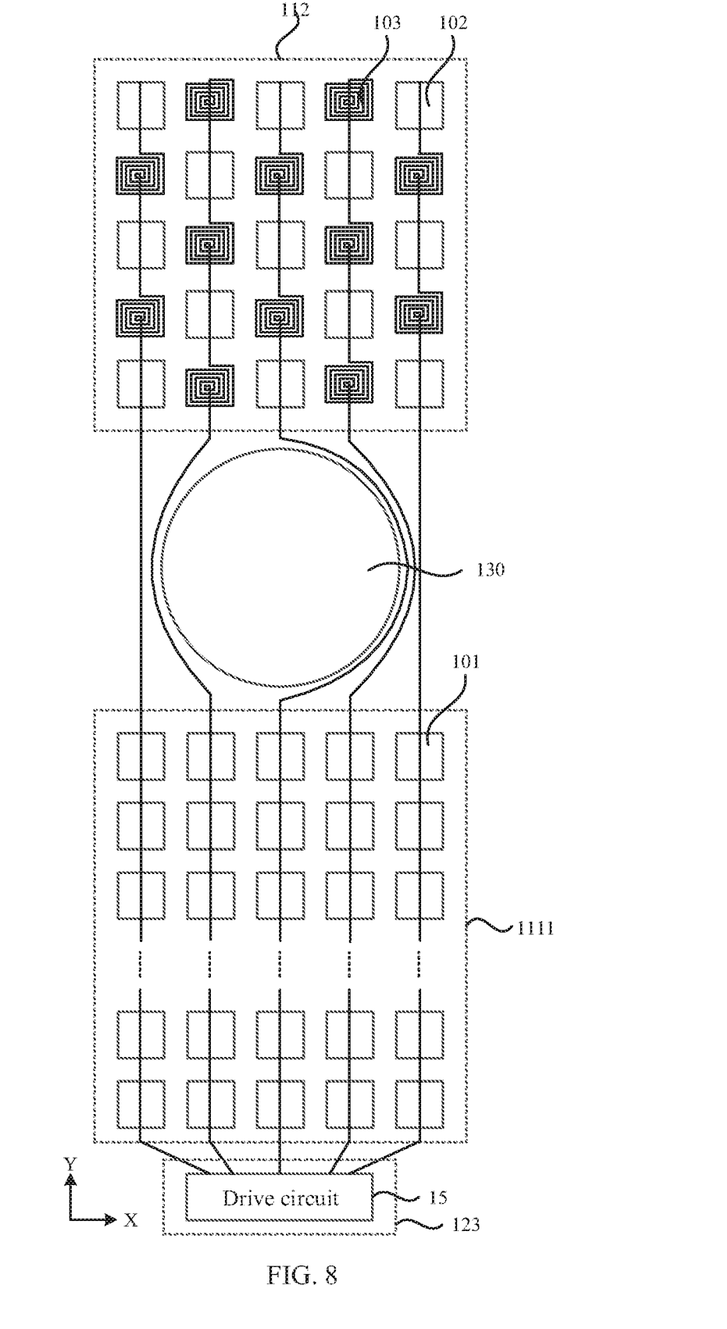
FIG. 8 is a structural diagram of distribution of a part of pixels on another array substrate according to an embodiment of the present disclosure.

The compensation resistors 103 may have a block structure shown in FIG. 7, and the compensation resistors 103 may have a plane spiral structure. As shown in FIG. 8, the compensation resistors 103 have the plane spiral structure. The compensation resistors with the plane spiral structure may also be disposed in the same layer as an existing film layer in the array substrate. For example, the compensation resistors with the plane spiral structure may be formed through the spiral winding of the corresponding signal lines.

It is to be noted that the above description is an exemplary illustration of the arrangement of the compensation resistors, and the compensation resistors may have other structures and forms on the premise that the compensation resistors compensate for the first pixels and the second pixels, which is not specifically limited herein.

Figure 9:
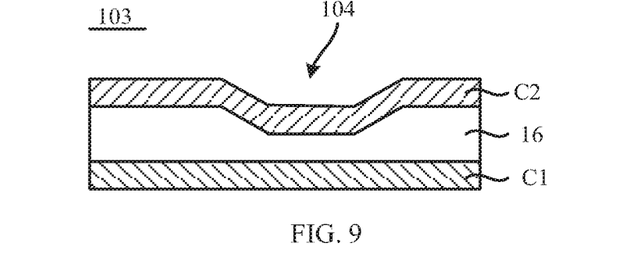
FIG. 9 is a structural diagram of a compensation unit according to an embodiment of the present disclosure.

In an embodiment, FIG. 9 is a structural diagram of a compensation unit according to an embodiment of the present disclosure. As shown in FIG. 9, when the compensation unit 13 is the compensation capacitor, the compensation capacitor 103 includes a first electrode C1 and a second electrode C2. An insulating layer 16 is disposed between the first electrode C1 and the second electrode C2. The insulating layer 16 between the first electrode C1 and the second electrode C2 is provided with a groove 104. The second electrode C2 of the compensation capacitor 103 extends along the groove 104.

Exemplarily, the array substrate may include metal layers disposed at intervals and insulating layers between two adjacent metal layers. The metal layer may be, for example, a gate metal layer, a source/drain metal layer, a capacitor metal layer, etc., where the gate metal layer may include a gate pattern of a thin film transistor and a scan signal line, the source/drain metal layer may include a source/drain pattern of a thin film transistor and a data signal line, and the capacitor metal layer may include an electrode of a capacitor of the pixel drive circuit. The first electrode C1 of the compensation capacitor 103 may be disposed in the same layer as any one of the metal layers of the array substrate, the second electrode C2 of the compensation capacitor 103 may be disposed in the same layer as another metal layer of the array substrate, and the first electrode C1 and the second electrode C2 are disposed on different layers. In order to adjust the size of the compensation capacitor 103, a groove 104 may be disposed between the first electrode C1 and the second electrode C2, so as to reduce the distance between the first electrode C1 and the second electrode C2 of the compensation capacitor 103, thereby achieving the purpose of adjusting the size of the compensation capacitor 103. In addition, the purpose of adjusting the size of the compensation capacitor 103 may also be achieved by adjusting the facing area between the first electrode C1 and the second electrode C2 of the compensation capacitor 103.

The groove 104 between the first electrode C1 and the second electrode C2 of the compensation capacitor 103 may be, for example, stripe-shaped and/or block-shaped. In order to prevent the groove 104 from being filled with other metal layers or insulating layers formed on a side of the first electrode C1 close to the second electrode C2, the groove 104 may be disposed in the insulating layer on a side of the second electrode C2 close to the first electrode C1 and adjacent to the second electrode C2. At this point, the second electrode C2 may extend along the groove 104, so as to achieve the purpose of adjusting the size of the compensation capacitor 103.

In this embodiment of the present disclosure, the pixel density of the second display area of the array substrate is less than the pixel density of the first display area, on the premise that the structure of the pixel in the first display area is the same as the structure of the pixel in the second display area, a larger space is formed between light-emitting areas of two adjacent second pixels in the second display area with smaller pixel density, and other sensors can be disposed in the space, so that the sensors do not need to occupy the non-display area in the array substrate, thereby increasing the area of the effective display area (i.e., the display area) and enhancing the display effect. The light-emitting area of the pixel is a light-transmitting area in a pixel.

In an embodiment, the array substrate further includes an insulating layer. The insulating layer includes a groove, and the groove is located between two adjacent second pixels. A thickness of the insulating layer in a position of the groove is less than a thickness of the insulating layer not in the position of the groove, and a thickness of a bottom of the groove is greater than or equal to 0.

Figure 10:
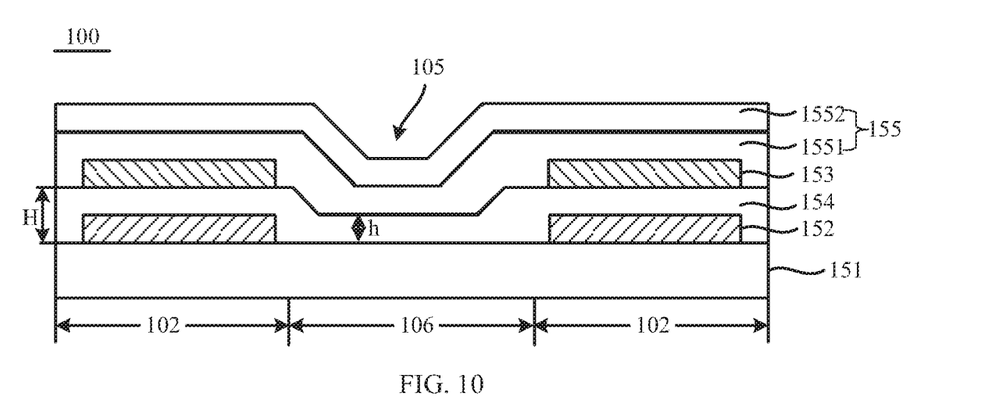
FIG. 10 is a structural diagram of a film layer of an array substrate according to an embodiment of the present disclosure.

Exemplarily, FIG. 10 is a structural diagram of a film layer of an array substrate according to an embodiment of the present disclosure. As shown in FIG. 10, the array substrate 100 includes a base substrate 151, metal layers 152 and 153 disposed on a side of the base substrate 151 at intervals, an interlayer insulating layer 154 between the metal layers 152 and 153, and a planarization insulating layer 155 on a side of the metal layer 153 facing away from the base substrate 151. Since the larger space 106 between light-emitting areas of two adjacent second pixels 102 may be provided with other sensors, the sensor may be, for example, an infrared sensor device in the light-sensitive device. The sensor disposed between two adjacent second pixels 102 has requirements of light transmittance. At this point, non-light-transmitting metal layers in the space 106 between two adjacent second pixels 102 can be removed, and at the same time, grooves may be set in the insulating layer between two adjacent second pixels 102 to improve the light transmittance between two adjacent second pixels 102. Using the interlayer insulating layer 154 as an example, the thickness h of the interlayer insulating layer 154 in a position where the groove 105 is disposed is less than the thickness of the interlayer insulating layer 154 in other positions where no groove is disposed, and the thickness h of the interlayer insulating layer 154 in the position where the groove 105 is disposed is greater than or equal to 0. In some embodiments, the planarization insulating layer 155 may include an organic insulating layer 1551 and an inorganic insulating layer 1552, and when the planarization insulating layer 155 is provided with grooves, the organic insulating layer 1551 may be provided with grooves to reduce process difficulty.

In this embodiment of the present disclosure, the array substrate includes a display area, a non-display area and an optical component setting area. The non-display area includes a first non-display area and a second non-display area, and the display area includes a first display area and a second display area. The optical component setting area may be configured to dispose an optical component, and the optical component may be, for example, a camera for collecting image information. In order to enable the optical component disposed in the optical component setting area to receive light, the optical component setting area needs to have a high light transmittance.

In an embodiment, the thickness of the array substrate in the optical component setting area is 0; or the array substrate in the optical component setting area is in the transparent state, and the thickness of the array substrate in the optical component setting area is greater than 0.

Figure 11:
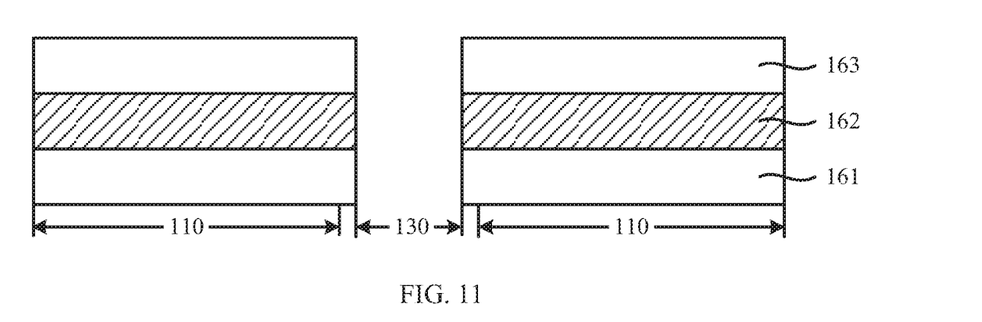
FIG. 11 is a structural diagram of a film layer of another array substrate according to an embodiment of the present disclosure.

Exemplarily, FIG. 11 is a structural diagram of a film layer of another array substrate according to an embodiment of the present disclosure. As shown in FIG. 11, the array substrate 110 may include a base substrate 161, a metal layer 162, an insulating layer 163, etc. The thickness of the array substrate 100 in the optical component setting area 130 is 0. That is, the base substrate 161, the metal layer 162 and the insulating layer 163 in the optical component setting area 130 are all removed to form a through hole, so that the optical component setting area 130 has a higher light transmittance.

Figure 12:
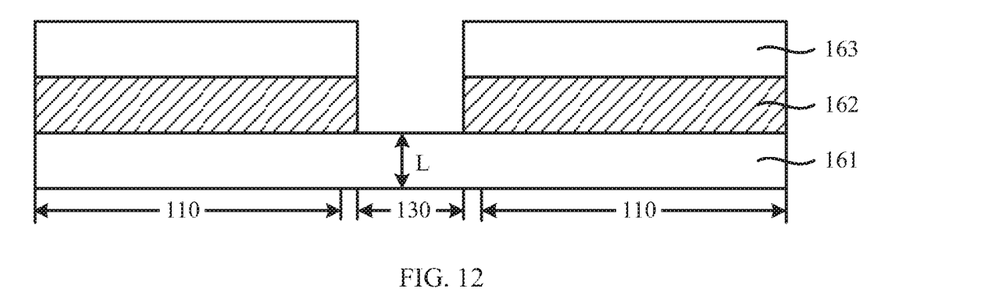
FIG. 12 is a structural diagram of a film layer of another array substrate according to an embodiment of the present disclosure.

Exemplarily, FIG. 12 is a structural diagram of a film layer of another array substrate according to an embodiment of the present disclosure. As shown in FIG. 12, the array substrate 110 may include the base substrate 161, the metal layer 162, the insulating layer 163, etc. The thickness L of the array substrate 100 in the optical component setting area 130 is greater than 0, and the optical component setting area 130 is in the transparent state. That is, a non-transparent film layer in the optical component setting 130 is removed, and only the film layer satisfying the light transmittance requirement of the optical component disposed in the optical component setting area 130 is remained. For example, the metal layer 162, the insulating layer 163 and the like of the optical component setting area 130 may be removed, and only the film layer of the base substrate 161 having a higher light transmittance may remain, so that a blind hole structure is formed in the optical component setting area 130, thereby ensuring that the array substrate 100 has a sufficient mechanical strength in the optical component setting area 130 while ensuring the high light transmittance.

Based on the same inventive concept, an embodiment of the present disclosure further provides a display panel. The display panel includes the array substrate provided by the embodiments of the present disclosure. Therefore, the display panel also has the beneficial effects of the array substrate provided by the embodiments of the present disclosure, and the same parts can be understood by referring to the above description, which will not be described in detail below. The display panel may be a liquid crystal display panel or an organic light-emitting display panel.

Figure 13:
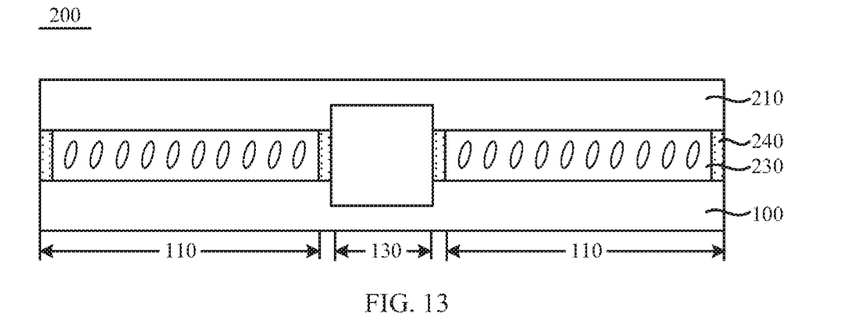
FIG. 13 is a structural diagram of a film layer of a liquid crystal display panel according to an embodiment of the present disclosure.

Exemplarily, FIG. 13 is a structural diagram of a film layer of a liquid crystal display panel according to an embodiment of the present disclosure. As shown in FIG. 13, the liquid crystal display panel 200 includes an array substrate 100, a color filter substrate 210, a liquid crystal layer 230 and a sealant 240. The liquid crystal layer 230 and the sealant 240 are located between the array substrate 100 and the color filter substrate 210. The liquid crystal display panel 200 has a display area 110 and an optical component setting area 130 corresponding to the array substrate 100. The optical component setting area 130 may be in the form of a blind hole. That is, the optical component setting area 130 may include only a transparent base substrate of the array substrate 100 and a transparent base substrate of the color film substrate 210.

Figure 14:
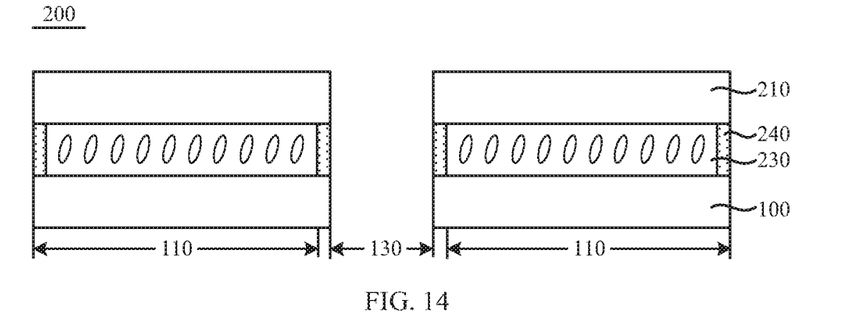
FIG. 14 is a structural diagram of a film layer of another liquid crystal display panel according to an embodiment of the present disclosure.

In addition, as shown in FIG. 14, the optical component setting area 130 may also be in the form of a through hole. That is, both the array substrate 100 and the color film substrate 210 in the optical component setting area 130 are removed, so that the optical component setting area 130 has a higher light transmittance. The same parts as those in FIG. 13 in FIG. 14 can be described with reference to FIG. 13, which will not be repeated herein.

Figure 15:
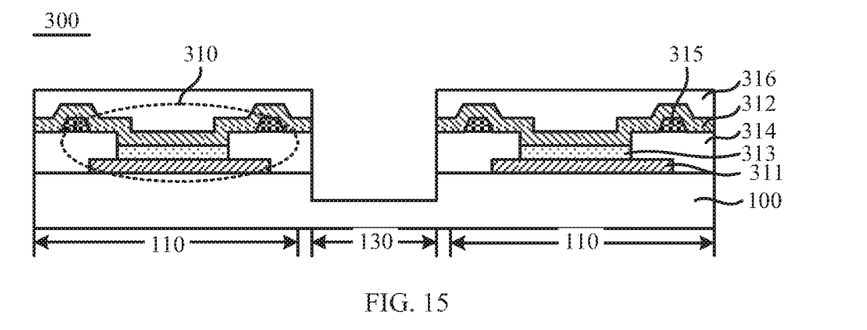
FIG. 15 is a structural diagram of a film layer of an organic light-emitting display panel according to an embodiment of the present disclosure.

Exemplarily, FIG. 15 is a structural diagram of a film layer of an organic light-emitting display panel according to an embodiment of the present disclosure. As shown in FIG. 15, the organic light-emitting display panel 300 includes an array substrate 100 and a light-emitting element 310 on one side of the array substrate 100. The light-emitting element 310 may include a first electrode 311, a second electrode 312, and a light-emitting layer 313 as well as other carrier functional layers (not shown) between the first electrode 311 and the second electrode 312. The organic light-emitting display panel 300 further includes a pixel defining layer 314, a support pillar 315, an encapsulation layer 316, and the like. The organic light-emitting display panel 300 has a display area 110 and an optical component setting area 130, which are corresponding to the array substrate 100. The optical component setting area 130 may be in the form of a blind hole. That is, the optical component setting area 130 may include only the transparent base substrate of the array substrate 100.

Figure 16:
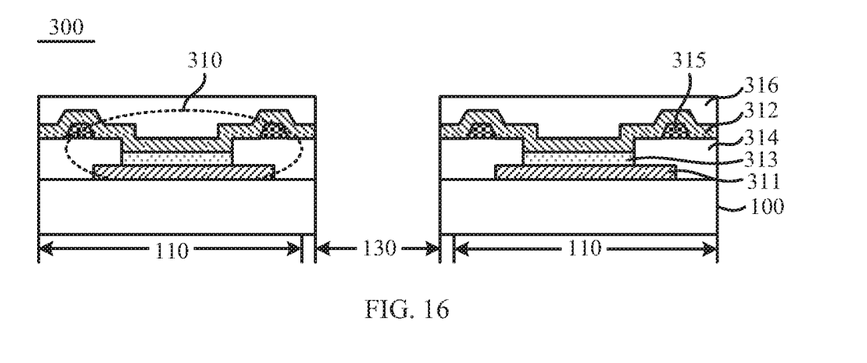
FIG. 16 is a structural diagram of a film layer of another organic light-emitting display panel according to an embodiment of the present disclosure.

In addition, as shown in FIG. 16, the optical component setting area 130 may also be in the form of a through hole. That is, the film layers of the array substrate 100 and the film layers of the light-emitting element 310 in the optical component setting area 130 are all removed, so that the optical component setting area 130 has a better light transmittance. The same parts in FIG. 16 as those in FIG. 15 can be described with reference to FIG. 15, which will not be repeated herein.

Based on the same inventive concept, an embodiment of the present disclosure further provides a display device. The display device includes the display panel provided by the embodiments of the present disclosure. Therefore, the display device also has the beneficial effects of the organic light-emitting display panel provided by the embodiments of the present disclosure, and the same parts can be understood with reference to the above description, which will not be described in detail below. The display device is provided with an optical component setting area corresponding to the display panel provided by the embodiments of the present disclosure, and the optical component setting area is provided with an optical component.

Figure 17:
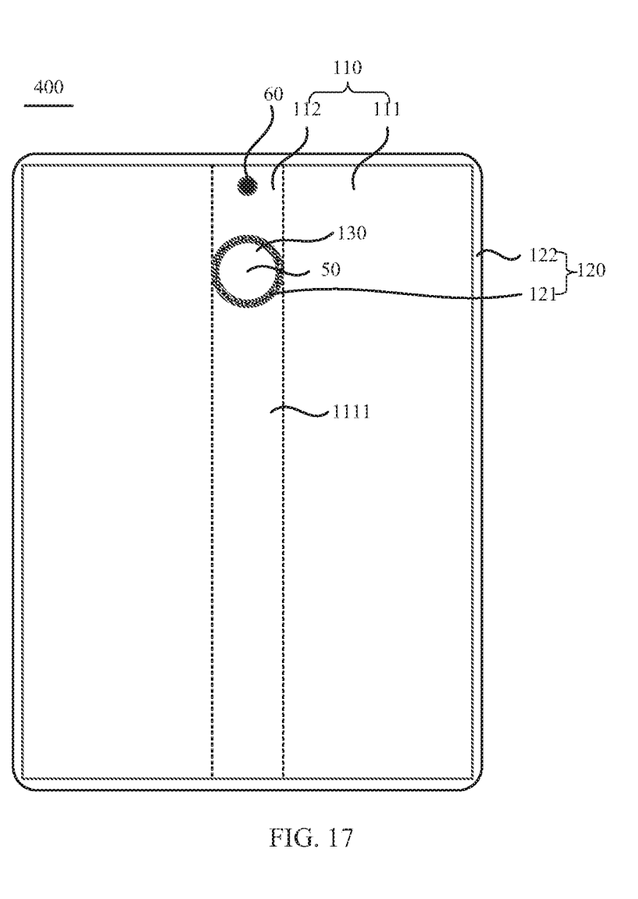
FIG. 17 is a structural diagram of a display device according to an embodiment of the present disclosure.

Exemplarily, FIG. 17 is a structural diagram of a display device according to an embodiment of the present disclosure. As shown in FIG. 17, the display device 400 includes a display area 110, a non-display area 120 and an optical component setting area 130 corresponding to the display panel. The non-display area includes a first non-display area 121 and a second non-display area 122. The display area includes a first display area 111 and a second display area 112. The first display area 111 may include a display sub-area 1111. The optical component setting area of the display device is provided with an optical component 50. The optical component 50 is, for example, one or more of a camera module, a light-sensitive sensor, an ultrasonic distance sensor, and other mobile phone assembles.

Exemplarily, the display device 400 is a mobile phone or a tablet. When the optical component 50 is a camera module, a photosensitive module setting area corresponds to an area where a front camera of the mobile phone or the tablet is located, and the optical component setting area 130 is configured to let the light to be emitted into the front camera for the front camera to collect external images. When the optical component 50 is a light-sensitive sensor, the light sensor may be a light sensor for sensing external light and adjusting the brightness of the display device 400, and may also be a light sensor for sensing whether an external fingerprint exists, thereby performing fingerprint recognition. The light sensor also receives external light through the photosensitive module setting area.

Exemplarily, the film layers of the optical component setting area in the display panel may be all removed. That is, a structure of a through hole penetrating the display panel is formed. The optical component 50 is disposed in the through hole structure. That is, the through hole structure is formed on the display device 400. Alternatively, a part of the film layers of the optical component setting area in the display panel may be remained. The remained film layers should satisfy the light transmittance requirement of the optical component 50. At this point, the optical component 50 is disposed on the back surface of the organic light-emitting display panel 200, i.e. on the opposite side of a light-emitting surface of the display panel. That is, a blind hole structure is formed on the display device 400.

In an embodiment, the display device may further include a light-sensitive device disposed corresponding to the second display area.

Exemplarily, with continued reference to FIG. 17, the pixel density of the second display area 112 is less than the pixel density of the first display area 111, and thus, there is sufficient space between two adjacent second pixels in the second display area 112 for disposing the light-sensitive device 60. In order to satisfy the light transmission requirement of the light-sensitive device 60, a part of the film layers of the display panel can be removed at the position where the light-sensitive device is disposed. The light-sensitive device 60 may be, for example, a light-sensitive sensor for adjusting the brightness of the display device 400, or may be a light-sensitive sensor for sensing whether an external fingerprint exists so as to perform fingerprint recognition.

Exemplarily, the display device 400 may be a mobile phone, a tablet PC, a smart wearable device (e.g., a smart watch), and other types of display devices known to those skilled in the art, which are not limited in the embodiments of the present disclosure.

It is to be noted that the above are merely some embodiments of the present disclosure and the technical principles used therein. It will be understood by those skilled in the art that the present disclosure is not limited to the specific embodiments described herein. Those skilled in the art can make various apparent modifications, adaptations and substitutions without departing from the scope of the present disclosure. Therefore, while the present disclosure has been described in detail through the above-mentioned embodiments, the present disclosure is not limited to the above-mentioned embodiments and may include more other equivalent embodiments without departing from the concept of the present disclosure. The scope of the present disclosure is determined by the scope of the appended claims.

What is claimed is:

1. An array substrate, comprising:
a display area, a non-display ara and an optical component setting area; wherein the non-display area comprises a first non-display area and a second non-display area; the first non-display area surrounds the optical component setting area, the display area surrounds the first non-display area, and the second non-display area surrounds the display area; and the display area comprises a first display area and a second display area, and the second display area is located between the first non-display area and the second non-display area and is connected to the first non-display area and the second non-display area respectively; and
a plurality of pixels, wherein the plurality of pixels comprise a plurality of first pixels and a plurality of second pixels, the first pixels are located in the first display area, the second pixels are located in the second display area, and a pixel density of the second display area is less than a pixel density of the first display area.

2. The array substrate of claim 1, wherein the second display area per unit area comprises n columns of the second pixels, and the first display area per unit area comprises m columns of the first pixels, wherein n is less than m, and n and m are positive integers.

3. The array substrate of claim 2, wherein the first display area comprises a display sub-area, and the display sub-area, the optical component setting area and the second display area are arranged in a second direction;
the second display area comprises P columns of the second pixels, the P columns of the second pixels are arranged in a first direction and extend in the second direction, the display sub-area comprises Q columns of the first pixels, and the Q columns of the first pixels are arranged in the first direction and extend in the second direction, wherein P is less than Q, and P and Q are positive integers; and
in the second direction, the P columns of the second pixels are in a one-column-to-one-column correspondence with P columns of the first pixels in the display sub-area.

4. The array substrate of claim 3, wherein the second non-display area comprises a drive circuit setting area for setting a drive circuit, and the drive circuit setting area is located on a side of the second non-display area adjacent to the display sub-area;
the array substrate further comprises a plurality of signal lines, the drive circuit is configured to provide signals for the plurality of signal lines, and the plurality of signal lines comprise a plurality of first signal lines and a plurality of second signal lines; and
one of the first signal lines is electrically connected to the first pixels and the second pixels in a same column, wherein the first signal lines extend in the second direction and run through the first non-display area in a winding manner; and one of the second signal lines is electrically connected to one column of the first pixels which are not in the same column as the second pixels.

5. The array substrate of claim 4, wherein the plurality of signal lines comprise at least one of: data signal lines, or positive power supply voltage signal lines.

6. The array substrate of claim 1, wherein the second display area further comprises at least one compensation unit, the compensation unit comprises a compensation load, and the compensation load is electrically connected to the second pixels.

7. The array substrate of claim 6, wherein the number of first pixels per unit area in the first display area is equal to a sum of both second pixels and compensation units per unit area in the second display area.

8. The array substrate of claim 6, wherein the compensation load comprises a compensation capacitor or a compensation resistor.

9. The array substrate of claim 8, wherein the compensation resistor comprises a block structure or a plane spiral structure.

10. The array substrate of claim 8, wherein the compensation capacitor comprises a first electrode and a second electrode, an insulating layer is disposed between the first electrode and the second electrode, and the insulating layer between the first electrode and the second electrode is provided with a groove;

wherein the second electrode of the compensation capacitor extends along the groove.

11. The array substrate of claim 1, further comprising an insulating layer, wherein the insulating layer comprises a groove, and the groove is located between two adjacent second pixels; and wherein a thickness of the insulating layer in a position of the groove is less than a thickness of the insulating layer not in the position of the groove, and a thickness of a bottom of the groove is greater than or equal to 0.

12. The array substrate of claim 1, wherein a thickness of the array substrate in the optical component setting area is 0; or the array substrate is in a transparent state in the optical component setting area, and the thickness of the array substrate in the optical component setting area is greater than 0.

13. The array substrate of claim 4, wherein the plurality of signal lines comprise at least one of: scan signal lines, light-emitting control signal lines, or reference signal lines.

14. The array substrate of claim 4, wherein the plurality of signal lines comprise at least one of: data signal lines, or positive power supply voltage signal lines; and the plurality of signal lines further comprise at least one of scan signal lines, light-emitting control signal lines, or reference signal lines.

15. The array substrate of claim 1, wherein the second display area further comprises at least one compensation unit, the compensation unit comprises a compensation load, and the compensation load is electrically connected to the first pixels.

16. The array substrate of claim 1, wherein the second display area further comprises at least one compensation unit, the compensation unit comprises a compensation load, and the compensation load is electrically connected to the second pixels and the first pixels.

17. The array substrate of claim 6, wherein the compensation load comprises a compensation capacitor and a compensation resistor.

18. A display panel, comprising an array substrate, wherein the array substrate comprises:

a display area, a non-display area and an optical component setting area; wherein the non-display area comprises a first non-display area and a second non-display area; the first non-display area surrounds the optical component setting area, the display area surrounds the first non-display area, and the second non-display area surrounds the display area; and the display area comprises a first display area and a second display area, and the second display area is located between the first non-display area and the second non-display area and is connected to the first non-display area and the second non-display area respectively; and a plurality of pixels, wherein the plurality of pixels comprise a plurality of first pixels and a plurality of second pixels, the first pixels are located in the first display area, the second pixels are located in the second display area, and a pixel density of the second display area is less than a pixel density of the first display area.

19. A display device, comprising:

a display panel; and an optical component;

wherein the display panel comprises an array substrate, the array substrate includes a display area, a non-display area, an optical component setting area and a plurality of pixels, and the optical component is disposed in the optical component setting area; and wherein the non-display area comprises a first non-display area and a second non-display area; the first non-display area surrounds the optical component setting area, the display area surrounds the first non-display area, and the second non-display area surrounds the display area; and the display area comprises a first display area and a second display area, and the second display area is located between the first non-display area and the second non-display area and is connected to the first non-display area and the second non-display area respectively; and wherein the plurality of pixels comprise a plurality of first pixels and a plurality of second pixels, the first pixels are located in the first display area, the second pixels are located in the second display area, and a pixel density of the second display area is less than a pixel density of the first display area.

20. The display device of claim 19, further comprising a light-sensitive device, and the light-sensitive device is disposed in the second display area.

* * * * *